(12) United States Patent
Chuang

(10) Patent No.: US 11,165,398 B2
(45) Date of Patent: Nov. 2, 2021

(54) CHOPPER-STABILIZED PROGRAMMABLE GAIN AMPLIFIER

(71) Applicant: TEXAS INSTRUMENTS INCORPORATED, Dallas, TX (US)

(72) Inventor: Shang-Yuan Chuang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 125 days.

(21) Appl. No.: 16/411,780

(22) Filed: May 14, 2019

(65) Prior Publication Data
US 2020/0136578 A1    Apr. 30, 2020

Related U.S. Application Data

(60) Provisional application No. 62/753,197, filed on Oct. 31, 2018.

(51) Int. Cl.
*H03F 3/45* (2006.01)
*H03G 3/30* (2006.01)

(52) U.S. Cl.
CPC .......... *H03F 3/45273* (2013.01); *H03G 3/30* (2013.01); *H03F 2203/45138* (2013.01)

(58) Field of Classification Search
CPC ....... H03F 3/45273; H03F 2203/45138; H03F 2200/516; H03F 3/213; H03F 2203/45356; H03F 3/211; H03F 3/303; H03F 3/45475; H03F 3/45179; H03F 3/005; H03F 3/45183; H03F 3/72; H03F 1/0277; H03G 3/30; H03G 1/0029; H03G 1/0088; H03G 1/0023
USPC .............................. 330/9, 51, 254, 257, 288
See application file for complete search history.

(56) References Cited

U.S. PATENT DOCUMENTS 10,530,302 B2 *   1/2020  Balasingam ........ H03F 3/45475

* cited by examiner

*Primary Examiner* — Khanh V Nguyen
(74) *Attorney, Agent, or Firm* — John R. Pessetto; Charles A. Brill; Frank D. Cimino

(57) ABSTRACT

A circuit including an amplifier having an input and an output. The circuit also includes a current-to-voltage amplifier having an input. The circuit further includes a current mirror coupled between the output of the amplifier and the input of the current-to-voltage amplifier. The current mirror is configured to chop current flowing through the first current mirror.

17 Claims, 4 Drawing Sheets

CHOPPER-STABILIZED PROGRAMMABLE GAIN AMPLIFIER

This application claims priority to U.S. Provisional Application No. 62/753,197, filed Oct. 31, 2018, which is hereby incorporated by reference.

BACKGROUND

In some signal processing applications, an analog signal in a first voltage domain is to be digitized by an analog-to-digital converter (ADC) in a second voltage domain. For example, the analog signal may comprise any voltage up to +/−18 V, but the ADC operates from a 5 V power supply, A programmable gain amplifier (PGA) is included to attenuate the analog signal in cases in which the analog signal is outside the 5 V range of the ADC. The amplifier also is capable of amplifying the analog signal in cases in which the analog signal is small.

SUMMARY

In one example, a circuit including an amplifier having an input and an output. The circuit also includes a current-to-voltage amplifier having an input. The circuit further includes a current mirror coupled between the output of the amplifier and the input of the current-to-voltage amplifier. The current mirror is configured to chop current flowing through the first current mirror. The current mirror has a 1:M current mirror ratio, wherein M is greater than or equal to 1.

BRIEF DESCRIPTION OF THE DRAWINGS

For a detailed description of various examples, reference will now be made to the accompanying drawings in which.

DETAILED DESCRIPTION

Figure 1:
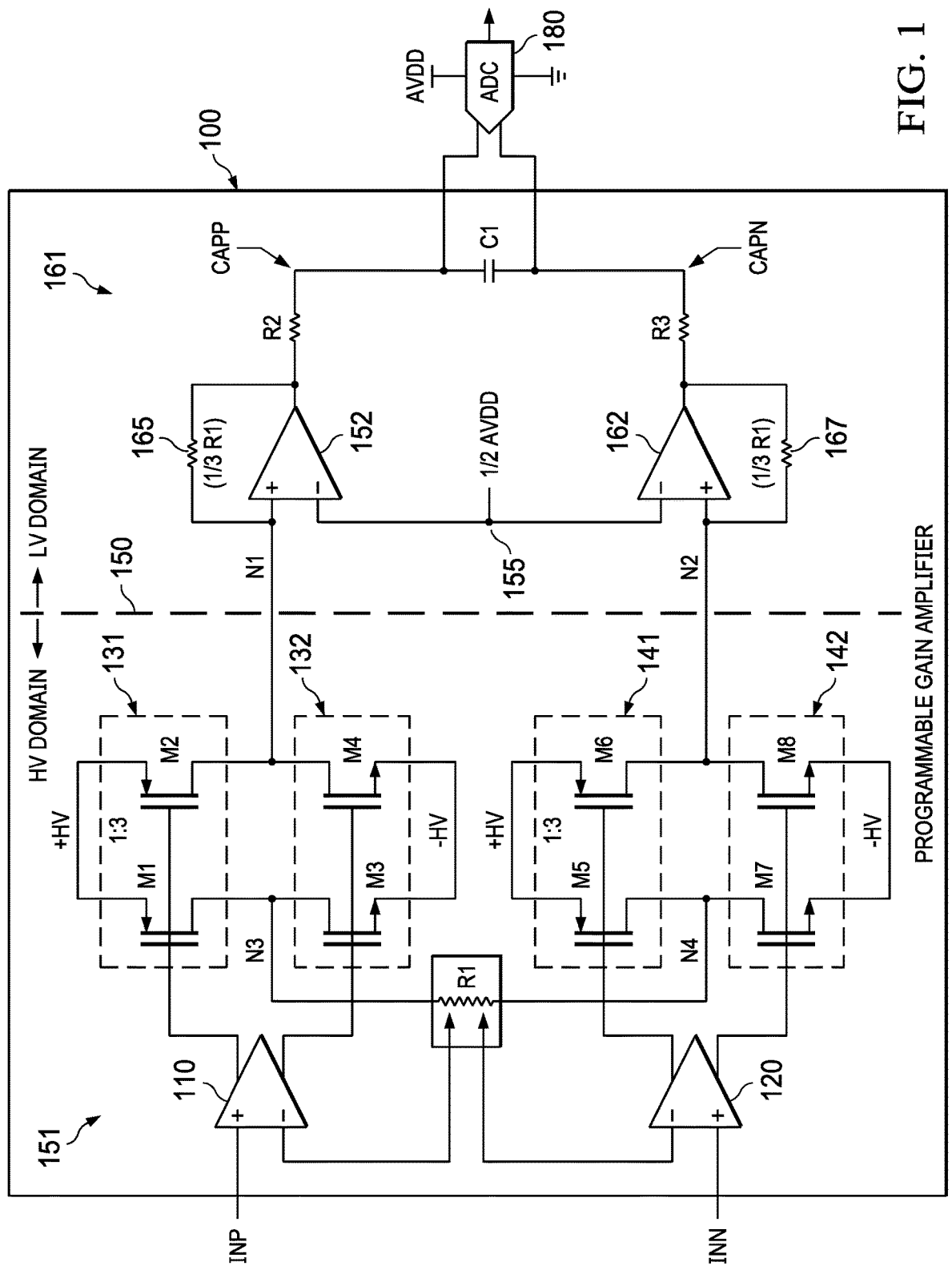
FIG. 1 shows an example of a programmable gain amplifier coupled to an analog-to-digital converter (ADC).

FIG. 1 shows an example of a system comprising a PGA 100 having an input stage 151 and an output stage 161. The PGA 100 is coupled to an ADC 180. In this example, the PGA 100 is configured to receive differential input signal INP and INN. The input signals have a common mode voltage that can be within a range of voltages. The dashed line 150 within the PGA 100 indicates the demarcation between two different voltage domains within the PGA. The left side of dashed line 150 is a higher voltage (HV) domain, and the left side of the dashed line 150 is a lower voltage (LV) domain. The supply rails +HV and −HV represent supply voltages within the HV domain, and AVDD represents the supply voltage for the LV domain. In one example, +HV and −HV is +18V and −18V, respectively, and AVDD is 5V. Different voltages are possible as well in other examples. The input signals INP and INN are between +HV and −HV. In the example in which +HV and −HV is +18V and −18V, INP and INN are between +18V and −18V. The common mode of INP and INN may be 0V or a voltage other than 0V. In one example, the differential voltage between INP and INN is 2V and the common mode voltage is 0V, meaning that INP is +1V and INN is −1V. In another example, the differential voltage between INP and INN is also 2V, but the common mode is 14V, meaning that INP is +15V and INN is +13V.

The ADC 180 in this example, however, operates from a lower supply voltage AVDD (e.g., 5V) than the +HV and −HV supply voltages of the HV domain. Further, the common mode of INP, INN may be higher (e.g., 14V) than the highest permitted voltage for the ADC 180 (e.g., 5V). As such, the PGA 100 adjusts the common mode of the input INP/INN to a predetermined common mode voltage, ½ AVDD, and provides adjustable gain (both attenuation and gain) to ensure the signal provided to the ADC 180 is within the proper input range for the ADC.

The input stage 151 of PGA 00 includes input amplifiers 110 and 120, a multi-tap resistor R1, and current mirrors 131, 132, 141, and 142. The output stage 161 includes amplifiers 152 and 162, resistors R2 and R3, and output capacitor C1. The voltage on the nodes on opposite sides of capacitor C1 (CAPP and CAPN) comprise the signal to be provided to the input of the ADC 180 for digitization. INP is provided to the positive (+) input of input amplifier 110, and INN is provided to the positive input of input amplifier 120. The gain within the input stage 151 is programmable. Resistor R1 comprises multiple resistors connected in series with a tap point between each series connected pair of resistors. The gain of the input stage 151 is programmable through selection of a desired tap point for connection to the negative (−) input of amplifiers 110 and 120.

Current mirror 131 comprises transistors M1 and M2. Current mirror 132 comprises transistors M3 and M4. Current mirror 141 comprises transistors M5 and M6. Current mirror 142 comprises transistors M7 and M8. In this example, transistors M1, M2, M5, and M6 are p-type metal oxide semiconductor field effect transistors (PMOS transistors), and transistors M3, M4, M7, and M8 are n-type metal oxide semiconductor field effect transistors (NMOS transistors). A transistor has a control input and a pair of current terminals. As MOS transistors, the control input is the gate, and the current terminals are the drain and source. In some implementations, one or more of the transistors M1-M8 are implemented as bipolar junction transistors (BJTs). As BJT transistors, the control input is the base, and the current terminals are the collector and emitter.

The differential output of amplifier 110 is coupled to the gates of transistors M1 and M2 as well as to the gates of transistors M3 and M4, as shown. The sources of transistors M1 and M2 are connected together and to the +HV supply rail of the HV domain. The sources of transistors M3 and M4 are connected together and to the −HV supply rail of the HV domain. The drains of M1 and M3 are connected together at node N3 and to one end terminal of resistor R1, and the drains of M2 and M4 are connected together at node N1. Node N1 is connected to the positive input of amplifier 152. The sources of transistors M5 and M6 are connected together and to the +HV supply rail. The sources of transistors M7 and M8 are connected together and to the −HV supply rail. The drains of M5 and M7 are connected together at node N4 and to the other end terminal of resistor R1 as shown, and the drains of M6 and M8 are connected together at node N2. Node N2 is connected to the positive input of amplifier 162.

The current mirror ratio of current mirrors 131, 132, 141, and 142 is 1:3, but can be a different ratio in other examples (e.g., 1:2, 1:4, etc.). The current mirrors 131, 132, 141, and 142 convert the output voltage from input amplifiers 110 and 120 into a current. With a current mirror ratio of 3, the current mirrors implement a gain factor of 3 for the current, and thus the output current from the current mirrors (through transistors M2, M4, M6, and M8) is three times the input current to the current mirrors (through transistors M1, M3, M5, and M7).

In the output stage 161, a resistor 165 is connected between node N1 and the output of amplifier 152, and a resistor 167 is connected between node N2 and the output of amplifier 162. With the current mirror ratio of the current mirrors being 1:3, the resistance of resistors 165 and 167 is ⅓ R1. That is, resistor 165 has a resistance configured to be ⅓ of the resistance selected between node N3 and the negative input of amplifier 110. Similarly, resistor 167 has a resistance configured to be ⅓ of the resistance selected between node N4 and the negative input of amplifier 120. The output of amplifier 152 is connected to resistor R2, and the output of amplifier 162 is connected to resistor R3. Amplifiers 152 and 162 convert the current from the current mirrors back to a voltage, and a signal indicative of that voltage across capacitor C1 is provided to the ADC 180. The negative inputs of amplifiers 152 and 162 are biased at ½ AVDD. For an example AVDD of 5 V, the bias voltage for the negative inputs of amplifiers 152 and 162 is 2.5V. Biasing the negative inputs of amplifiers 152 and 162 at ½ AVDD forces the common mode between nodes N1 and N2 to be ½ AVDD.

By providing a gain in the current mirrors 131, 132, 141, and 142 on the output of the input amplifiers 110 and 120, the overall noise of the output signal from the PGA 100 is reduced, compared to using, for example, current mirrors with 1:1 current mirror ratio. Gain in the current mirror (e.g., 1:3) reduces the noise especially for the attenuation mode. Because overall noise performance is input-referred, implementing the gain stage at the earlier stage (i.e., closer to the input of the amplifier) helps reduce noise. For the attenuation mode, amplifiers 110 and 120 are always set at gain of 1 so by putting gain in the current mirror, the overall noise is reduced.

Figure 2:
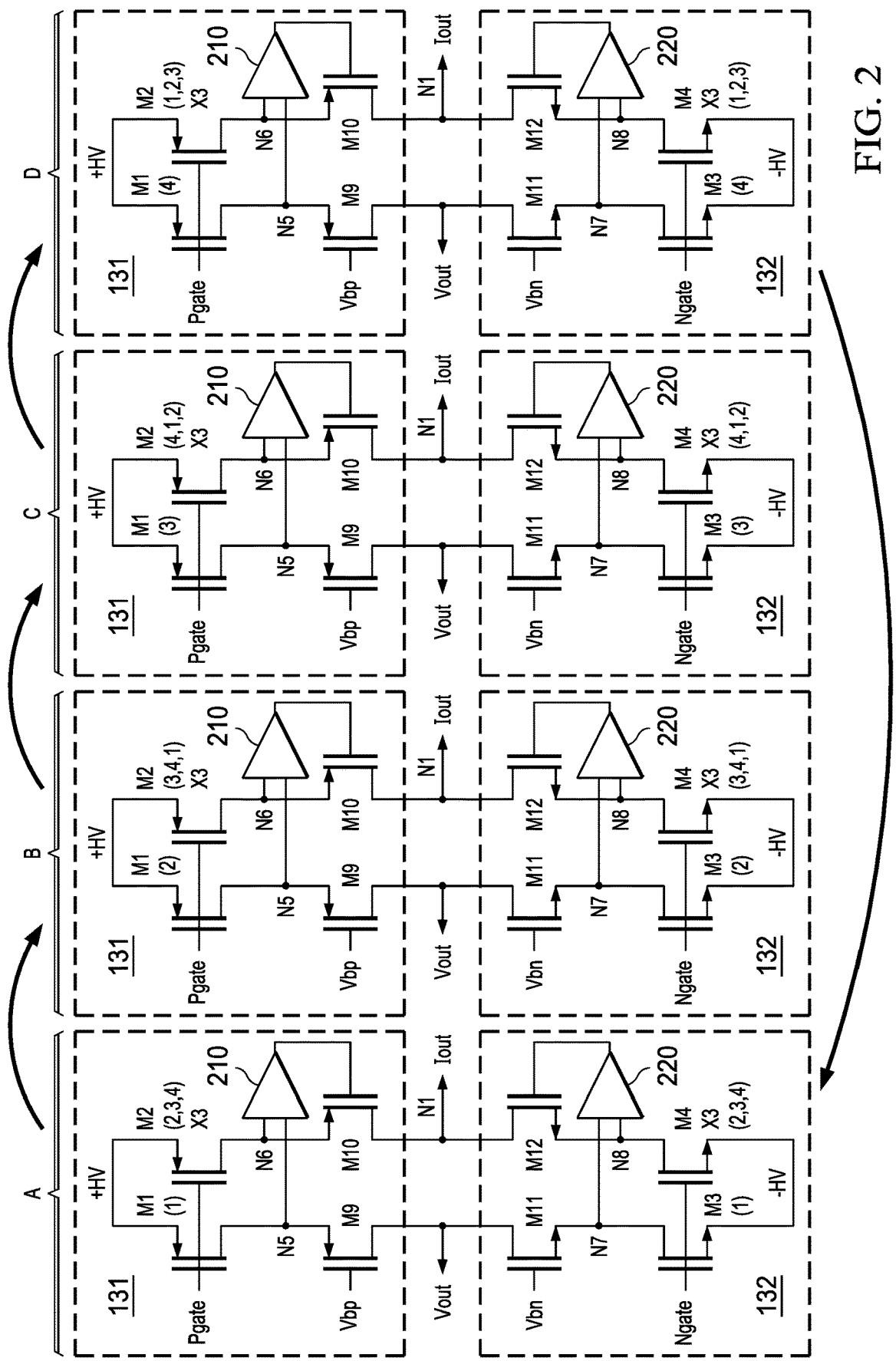
FIG. 2 illustrates chopping implemented in current mirrors within the programmable gain amplifier.

Chopping is also employed within the current mirrors to eliminate the effects of any current element mismatch (e.g., mismatch in transistor characteristics). FIG. 2 illustrates chopping within current mirrors 131 and 132. The same implementation can be employed for chopping within current mirrors 141 and 142. Four cycles A, B, C, and D are illustrated for the chopping technique implemented for the current mirrors. In this example, the chopping pattern repeats every four cycles. Current mirror 131 within each cycle A-D includes transistors M1 and M2, as well as transistors M9 and M10 and an error amplifier 210. In this example, transistors M9 and M10 are PMOS transistors. The source of transistor M9 is connected to the drain of transistor M1 at node N5, and the source of transistor M10 is connected to the drain of transistor M2 at node N6. The inputs to error amplifier 210 are connected to nodes N5 and N6. As such, error amplifier 210 amplifies the difference in the voltage been nodes N5 and N6. The gate of transistor M9 is biased at a voltage labeled Vbp, and the output of error amplifier 210 is connected to the gate of transistor M10. The output signal from the error amplifier 210 controls the gate-to-source voltage (Vgs) of transistor M2. The drain current through transistor M2 is controlled to be three-times the drain current through transistor M1 with the error amplifier controlling transistor M10 to maintain the 3× current through transistor M2.

The current mirror 132 is similarly configured. Current mirror 131 within each cycle A-D includes transistors M3 and M4, as well as transistors M11 and M12 and an error amplifier 220. In this example, transistors M11 and M12 are NMOS transistors. The source of transistor M11 is connected to the drain of transistor M3 at node N7, and the source of transistor M12 is connected to the drain of transistor M4 at node N8. The inputs to error amplifier 220 are connected to nodes N7 and N8. As such, error amplifier 220 amplifies the difference in the voltage been nodes N7 and N8. The gate of transistor M11 is biased at a voltage labeled Vbn, and the output of error amplifier 220 is connected to the gate of transistor M12. The output signal from the error amplifier 220 controls the gate-to-source voltage of transistor M4. The drain current through transistor M4 is controlled to be three-times the drain current through transistor M3 with the error amplifier 220 controlling the Vgs of transistor M12 to maintain the 3× current through transistor M4.

Figure 3:
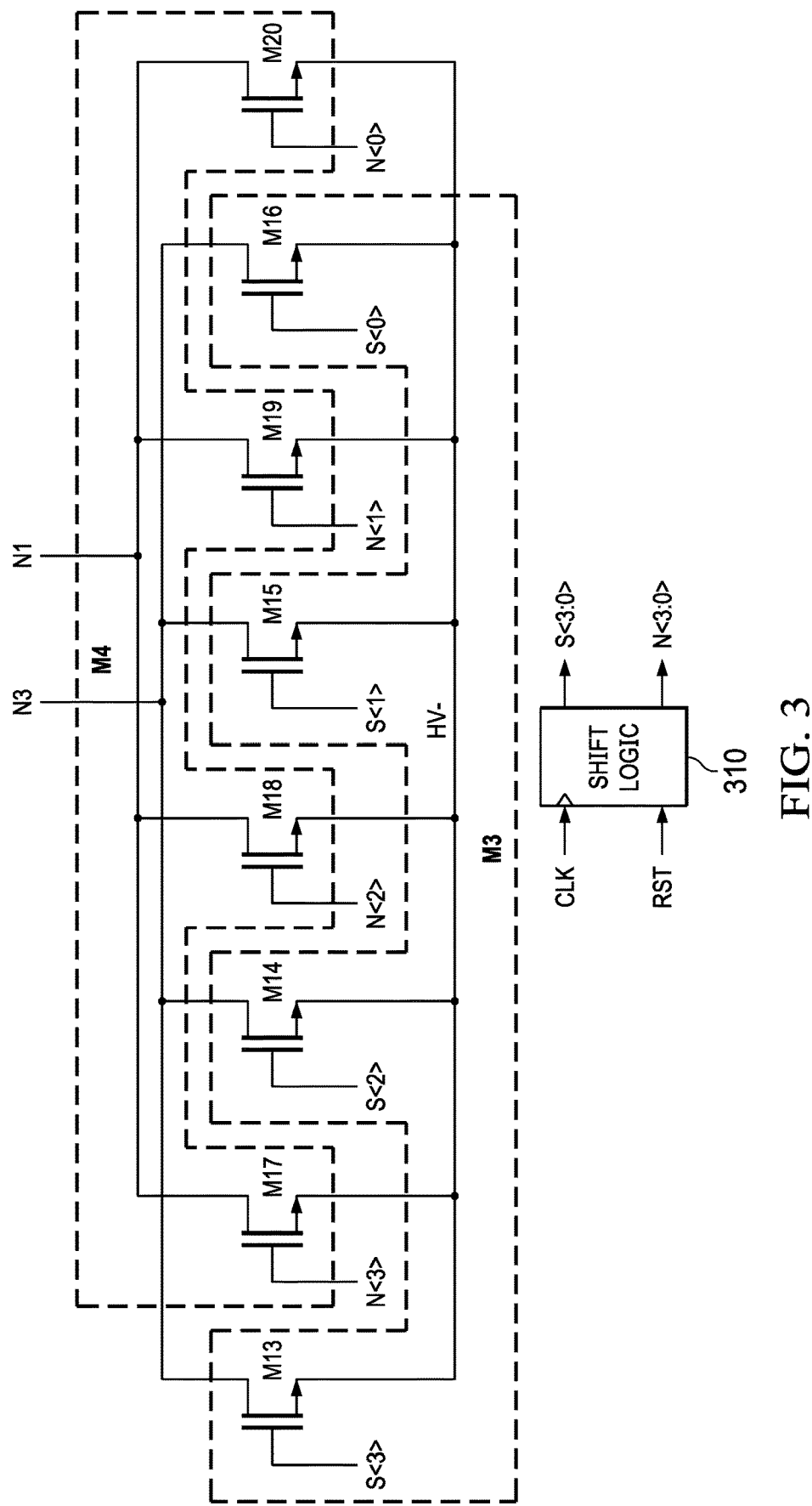
FIG. 3 shows an example implementation of the use of a shift logic circuit to control the power state of multiple transistors to implement chopping.

Referring still to FIG. 3, the numbers in parentheses adjacent transistors M1, M2, M3, and M4 illustrate the chopping technique. Transistor pair M1 and M2 is implemented from a selection and configuration of four transistors numbered 1, 2, 3, and 4. Similarly, transistor pair M3 and M4 is implemented from a selection and configuration of another four transistors numbered also numbered 1, 2, 3, and 4 for illustration purposes. Transistors 1-4 associated with transistors M1 and M2 are all of the same size, as are transistors 1-4 associated with transistor M3 and M4.

In cycle A, transistor M1 (the X1 size transistor) is implemented with transistor 1, while transistor M2 (the X3 transistor) is implemented with transistors 2-4. In cycle B, the X1 transistor M1 is implemented with transistor 2, while the X3 transistor M2 is implemented with transistors 1, 3, and 4. In cycle C, the X1 transistor M1 is implemented with transistor 3, while the X3 transistor M2 is implemented with transistors 1, 2, and 4. In cycle D, the X1 transistor M1 is implemented with transistor 4, while the X3 transistor M2 is implemented with transistors 1, 2, and 3. Thus, each of the transistors 1-4 are rotated being used to implement the smaller X1 transistor within the current mirror 131 over the course of four cycles A-D, and then the pattern repeats. The same transistor rotation pattern is implemented as well for current mirror 132.

In the example of FIG. 2, one transistor is used for the X1 transistor and three transistors are used for the X3 transistor within the current mirror. In other implementations, two transistors could be used to implement the X1 transistor and six transistors used to implement the X3 transistor and thus still maintain the 1:3 ratio for the current mirror. In general, H transistors are used for the X1 transistor (where H is an integer greater than or equal to 1) and 3H transistors are used for the X3 transistor.

FIG. 3 shows an example implementation of the current mirror 132 comprising transistors M1 and M2 employing a chopping technique. The example of FIG. 3 includes shift logic circuit 310 and transistors M13-M20. The sources of all of transistors M13-M20 are connected together. The drains of transistors M13, M14, M15 and M16 are connected together at node N3. The drains of transistors M17, M18, M19 and M20 are connected together at node N1. The gate of each transistor M13-M20 is driven with a separate signal generated by shift logic 310. Shift logic circuit 310 generates signals S<3:0> to drive the gates of transistors M13-M16 as shown, and generates signals N<3:0> to drive the gates of transistors M17-M20. As such, shift logic circuit 310 can separately control the power state of the transistors M13-M20.

Transistor M1 is implemented in each of the four cycles using a single transistor, while transistor M2 is implemented in each cycle using three transistors. Shift logic circuit 310 controls which one transistor from among M13-M16 is turned on each cycle to implement transistor M1, and which three transistors from among M17-M20 are turned on to implement transistor M2. In one example, control signals S<3:0> comprise four bits with one of the four bits in each cycle being a logic 1 and the other three bits being a logic 0. The one bit that is a logic 1 causes the corresponding transistor M13-M16 to turn on, and the other three bits that are logic 0 cause those corresponding transistors to turn off. The bit within S<3:0> that is a logic 1 rotates every time each time the clock input to shift logic circuit 310 is active (positive transitioning edges, negative transitioning edges)

Control signals N<3:0> also comprise four bits, and three of the four bits are logic 1 in each cycle and one bit is a logic 0. The three transistors M17-M20 whose gates receive a logic 1 from shift control 310 turn on, while remaining transistor is off. The shift logic circuit 310 rotates which of the four transistors M17-M20 are turned on. In one example, N<3:0> is the logic inverse of S<3:0>.

In one example, the rotating pattern of S<3:0> and N<3:0> four cycles of the shift control circuit 310 is provided below in Table I, along with the identification of those transistors that are on and those that are off in each of the corresponding cycles.

TABLE I

| S<3:0> | N<3:0> | M13 | M14 | M15 | M16 | M17 | M18 | M19 | M20 |
|---|---|---|---|---|---|---|---|---|---|
| 1000 | 0111 | on | off | off | off | off | on | on | on |
| 0100 | 1011 | off | on | off | off | on | off | on | on |
| 0010 | 1101 | off | off | on | off | on | on | off | on |
| 0001 | 1110 | off | off | off | on | on | on | on | off |

The configuration of the transistor pairs M1/M2, M5/M6, and M7/M8 is implemented in the same manner as shown in FIG. 3 for transistors M3 and M4 (although transistor pairs M1/M2 and M5/M6 comprise PMOS transistors).

Figure 4:
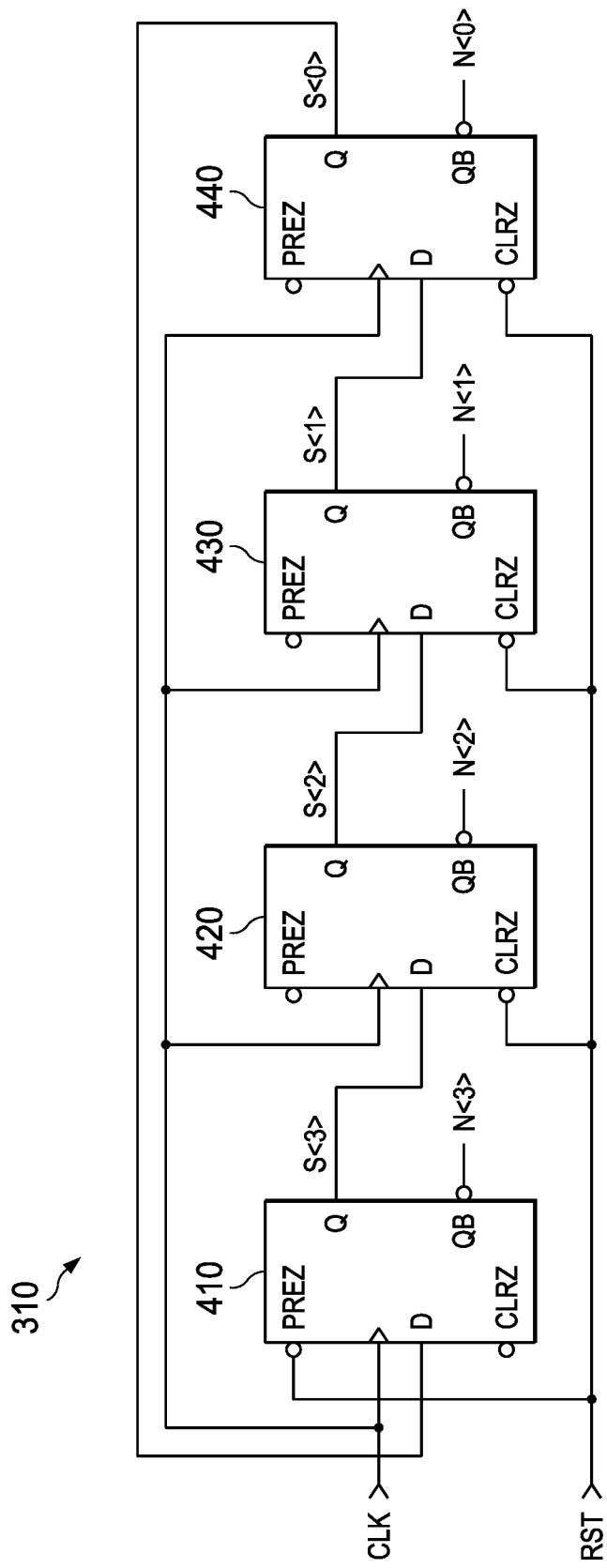
FIG. 4 shows an example implementation of the shift logic circuit of FIG. 3.

FIG. 4 shows an example implementation of shift logic circuit 310. In this example, shift logic circuit 310 comprises four D flip-flops 410, 420, 430, and 440. Each D flip-flop 410-440 comprises a data (D) input, a clock input, a preset input (PREZ), and clear input (CLRZ). The PREZ and CLRZ inputs are active low. A logic low signal on the PREZ input causes the Q output of the flip-flop to be asserted to a logic 1 (and thus the Q bar output, QB, will be a logic 0). A logic low signal on the CLRZ input causes the Q output of the flip-flop to be a logic 0 (and thus the QB output will be a logic 1).

The reset signal (RST) is an active low signal to initialize the shift logic circuit 310. RST is provided to the PREZ input of D flip-flop 410 and to the CLRZ inputs of each of D flip-flops 420-440. Thus, when RST is low, the Q output of D flip-flop 410 is asserted high and the QB outputs of the D flip-flops 420, 430, and 440 are forced low. The S<3>, S<2>, S<1>, and S<0> control signals are the Q outputs of D flip-flops 410, 420, 430, and 440, respectively. The N<3>, N<2>, N<1>, and SN<0> control signals are the QB outputs of D flip-flops 410, 420, 430, and 440, respectively. Thus, when RST is asserted low, S<3:0> becomes <1000>, and N<3:0> becomes <0111>.

The Q output of D flip-flop 410 is coupled to the D input of D flip-flop 420. The Q output of D flip-flop 420 is coupled to the D input of D flip-flop 430, and the Q output of D flip-flop 430 is coupled to the D input of D flip-flop 440. The Q output of D flip-flop 440 is provided to the D input of D flip-flop 410.

After RST asserts low to initialize the S<3:0> and N<3:0> control signals, RST is forced high to release the reset state of the D flip-flops 410-440. At that point, the state of the D flip-flops is controlled by the clock. With each assertion of the clock, the Q output of each D flop-flop is asserted to the logic level of its D input, which is the logic level of the preceding D flip-flop's Q output. As such, the D flip-flops in the example of FIG. 4 implement the shift functionality described above in Table I.

In this description, the term "couple" or "couples" means either an indirect or direct wired or wireless connection. Thus, if a first device couples to a second device, that connection may be through a direct connection or through an indirect connection via other devices and connections. Modifications are possible in the described embodiments, and other embodiments are possible, within the scope of the claims.

What is claimed is:

1. A circuit, comprising:
   a first amplifier having an input and an output;
   a current-to-voltage amplifier having an input; and
   a first current mirror coupled between the output of the first amplifier and the input of the current-to-voltage amplifier, the first current mirror including:
   a first plurality of transistors from which at least one, but not all, of the transistors is activated in each clock cycle to pass a first current controlled by the output of the first amplifier; and
   a second plurality of transistors from which at least two, but not all, of the transistors are activated in each clock cycle to pass a second current that mirrors the first current according to a current mirror ratio of the first current mirror; and
   a shift logic circuit having a clock input and having multiple outputs, each shift logic circuit output coupled to a respective transistor of the first and second pluralities of transistors, the shift logic circuit is configured to activate a different transistor of the first plurality of transistors from one clock cycle to the next.

2. The circuit of claim 1, wherein the second plurality of transistors includes four transistors, and wherein, for each clock cycle, the shift logic circuit is configured to:
   activate only one transistor of the first plurality of transistors; and
   activate three transistors from among the four transistors of the second plurality of transistors.

3. The circuit of claim 2, wherein the first plurality of transistors includes four transistors, and wherein the shift logic circuit is configured to activate a different group of three transistors from among the four transistors of the second plurality from one clock cycle to the next out of every four clock cycles.

4. The circuit of claim 1, further comprising:
   a second current mirror coupled between the output of the first amplifier and the input of the current-to-voltage amplifier, the second current mirror including:

a third plurality of transistors from which at least one, but not all, of the transistors is activated in each clock cycle to pass a third current controlled by the output of the first amplifier; and a fourth plurality of transistors from which at least two, but not all, of the transistors are activated in each clock cycle to pass a fourth current that mirrors the third current according to a current mirror ratio of the second current mirror.

5. The circuit of claim 4, wherein each transistor of the first and second pluralities of transistors comprise p-type metal oxide semiconductor field effect transistors, and wherein each transistor of the third and fourth pluralities of transistors comprise n-type metal oxide semiconductor field effect transistors.

6. The circuit of claim 1, wherein the shift logic circuit comprises:
a first flip-flop having an output; and
a second flip-flop having an input coupled to the output of the first flip-flop.

7. The circuit of claim 6, wherein the first flip-flop has a clock input configured to receive a clock, and the second flip-flop also has a clock input configured to a receive the clock.

8. The circuit of claim 1, wherein:
the shift logic circuit comprises a plurality of serially-coupled flip-flops, each of the plurality of flip-flop having an input and an output;
the output of each flip-flop is coupled to the input of another flip-flop;
each transistor of the first and second pluralities of transistors having a control input; and
the output of each of the plurality of flip-flops is coupled to the control input of a respective transistor.

9. The circuit of claim 8, wherein each of the plurality of flip-flops includes a preset input and a clear input, one or the other of the preset input or the clear input is configured to receive a reset signal configured to initialize a state of the outputs of the flip-flops.

10. A circuit, comprising:
a first plurality of metal oxide semiconductor field effect transistors, each transistor of the first plurality having a gate, a drain, and a source;
a second plurality of metal oxide semiconductor field effect transistors, each transistor of the second plurality having a gate, a drain, and a source;
the sources of each transistor of the first and second pluralities coupled together;
the drains of each transistor of the first plurality coupled together at a first node;
the drains of each transistor of the first plurality coupled together at a second node, the first node not coupled to the second node;
the gates of each transistor of the first and second pluralities is configured to receive separate control signals.

11. The circuit of claim 10, wherein the first plurality of transistors comprises four metal oxide semiconductor field effect transistors, and the second plurality of transistors comprises four metal oxide semiconductor field effect transistors.

12. The circuit of claim 11, wherein in each clock cycles of a clock signal, only one of the first plurality of transistors is configured to be on and three of the four transistors of the second plurality of transistors are configured to be on.

13. The circuit of claim 12, further comprising a shift logic circuit having a clock input configured to receive the clock, the shift logic circuit having at least eight control outputs, each of the eight control outputs coupled to a respective gate of the first or second pluralities of transistors.

14. The circuit of claim 10, wherein all of the transistors of the first and second pluralities of metal oxide semiconductor field effect transistors comprise n-type metal oxide semiconductor field effect transistors.

15. The circuit of claim 10, wherein all of the transistors of the first and second pluralities of metal oxide semiconductor field effect transistors comprise p-type metal oxide semiconductor field effect transistors.

16. A circuit, comprising:
an amplifier having an input and an output;
a current-to-voltage amplifier having an input; and
a current mirror coupled between the output of the amplifier and the input of the current-to-voltage amplifier, the first current mirror configured to chop current flowing through the first current mirror, and the current mirror having a 1:M current mirror ratio, wherein M is greater than 1;
wherein the current mirror includes:
a first plurality of transistors from which at least one, but not all, of the transistors is activated in each clock cycle to pass a first current controlled by the output of the amplifier; and
a second plurality of transistors from which at least two, but not all, of the transistors are activated in each clock cycle to pass a second current that mirrors the first current according to the current mirror ratio;
further comprising a shift logic circuit having a clock input and having multiple outputs, each shift logic circuit output coupled to a respective transistor of the first and second pluralities of transistors, the shift logic circuit is configured to activate a different transistor of the first plurality from one clock cycle to the next.

17. The circuit of claim 16, wherein the shift logic is configured to activate a different set of at least two of the transistors of the second plurality from one clock cycle to the next.

* * * * *